United States Patent [19]

Okamoto et al.

[11] 4,259,634
[45] Mar. 31, 1981

[54] VOLTMETER OF THE LIQUID CRYSTAL DISPLAY TYPE

[75] Inventors: Tsuneo Okamoto, Hasuda; Toshio Wakao, Kodaira, both of Japan

[73] Assignees: Dainippon Ink & Chemicals, Inc., Tokyo; Kawamura Institute of Chemical Research, Saitama; Wakao Kogei Kabushiki Kaisha, Tokyo, all of Japan

[21] Appl. No.: 11,909

[22] Filed: Feb. 13, 1979

[30] Foreign Application Priority Data

Feb. 17, 1978 [JP] Japan .............................. 53-18541[U]

[51] Int. Cl.³ ............................................ G01R 31/00
[52] U.S. Cl. ....................................... 324/74; 324/96; 324/157
[58] Field of Search ............... 324/96, 60 R, 133, 157, 324/109, 74, 130

[56] References Cited

U.S. PATENT DOCUMENTS 3,425,049  1/1969  Robinson .............................. 324/133

Primary Examiner—Ernest F. Karlsen
Attorney, Agent, or Firm—Sherman & Shalloway

[57] ABSTRACT

An improved voltmeter of the liquid crystal display type comprising an electrically insulated casing 4, a detecting electrode 9 secured to its forward end, a liquid crystal display element 1 within the casing electrically connected to said detecting electrode, a grounded electrode 12 within the casing electrically connected to said display element, and a window 14 at the rear end of said casing for detecting the operation of said display element therethrough. The improvement consists in the further inclusion of a piezoelectric unit 2 and a pressurizing mechanism 3 in the casing 4. The normal operation of said liquid crystal display element can be confirmed through said window by applying to said liquid crystal display element a voltage which is produced in said piezoelectric unit when it is flexed by said pressurizing mechanism. In a preferred embodiment, a condenser 11 is disposed between, and electrically connected to, said detecting electrode and said liquid crystal display element, said condenser consisting of an electrically insulated tubular body 11b having one end closed, a rod-like or tubular internal electrode 11a encased within said tubular body, and a tubular external electrode 11c provided externally in contact with said tubular body. (See FIG. 5.)

3 Claims, 6 Drawing Figures

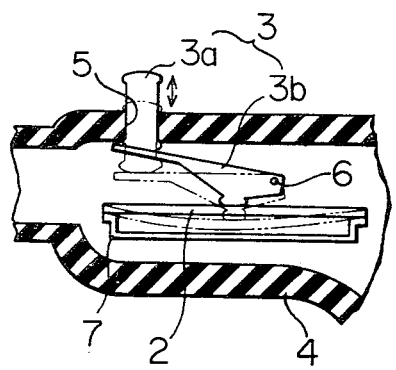
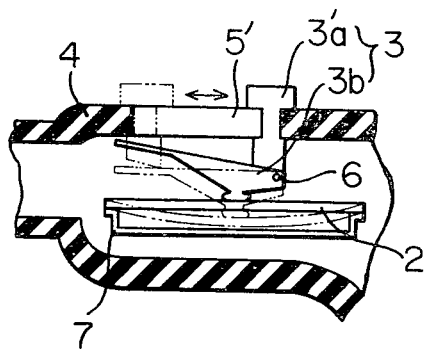
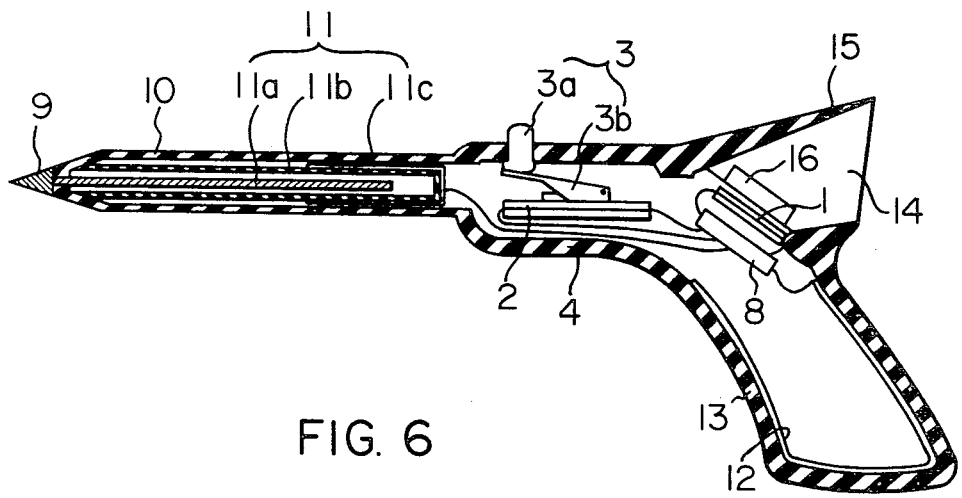
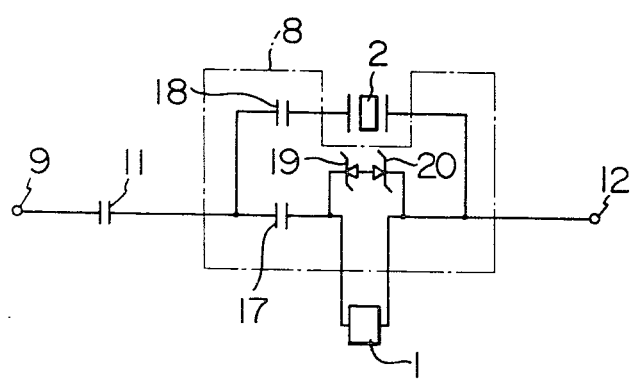

VOLTMETER OF THE LIQUID CRYSTAL DISPLAY TYPE

This invention relates to a voltmeter, or voltage detector, of the liquid crystal display type. More specifically, this invention relates to an improved voltmeter of the liquid crystal display type having high safety in which the normal operation of a liquid crystal display element can be inspected immediately before voltage detection.

When a voltmeter is damaged or debased, voltage detection may be mistaken, and there is a risk of causing a serious accident such as injury or death by electric shock. It is desirable therefore to confirm by a simple inspecting procedure just before detection whether it operates normally or not. It is especially important to inspect and confirm the normal operation of a voltage display device of the voltmeter. Japanese Laid-Open Utility Model Publication No. 20078/78 already suggested a voltmeter including a liquid crystal display element as a voltage display device, but no voltmeter of high safety has been proposed to date which is so constructed that the normal operation of a liquid crystal display element can be inspected and confirmed prior to detection.

It is an object of this invention therefore to provide such a voltmeter having high safety.

According to this invention, there is provided a voltmeter of the liquid crystal display type, said voltmeter comprising an electrically insulated casing, a detecting electrode secured to its forward end, a liquid crystal display element within the casing electrically connected to said detecting electrode, a grounded electrode within the casing electrically connected to said liquid crystal display element, and a window at the rear end of said casing for detecting the operation of said liquid crystal display element therethrough, said casing further including a piezoelectric unit and a pressurizing mechanism so that the normal operation of said liquid crystal display element can be confirmed through said window by applying a voltage to said liquid crystal display element, said voltage being produced in said piezoelectric unit when said piezoelectric unit is flexed by said pressurizing mechanism.

Briefly stated, the characteristic feature of the present invention is that in a voltmeter including a liquid crystal display element as a device for displaying the detected voltage, a piezoelectric unit is electrically connected to the liquid crystal display element so that the voltage generated in the piezoelectric unit may be applied to the liquid crystal display element, and also a pressurizing mechanism is provided which can slowly flex the piezoelectric unit to generate a voltage of the magnitude sufficient to drive the liquid crystal display element; and that by operating these devices, the driving of the liquid crystal display element can be inspected and confirmed just prior to voltage detection.

The present invention is specifically described below with reference to the accompanying drawings in which:

FIG. 1 is a cross-sectional view showing one example of the piezoelectric unit and the pressurizing mechanism;

FIG. 2 is a cross-sectional view showing another example of the piezoelectric unit and the pressurizing mechanism;

FIG. 5 is a cross-sectional view showing the voltmeter in its entirety; and

FIG. 6 is an electric circuit diagram.

Figure 3:
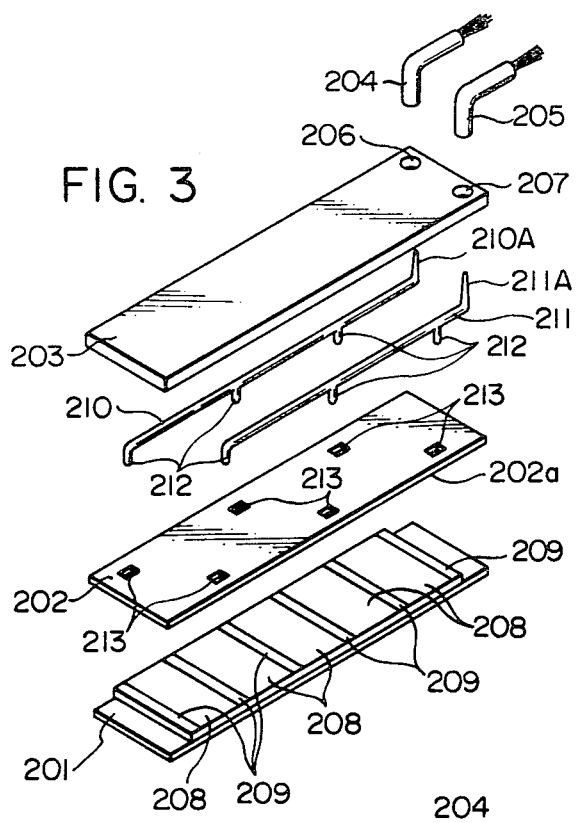
FIG. 3 is an exploded view of the piezoelectric unit.

Referring to FIG. 1, a piezoelectric unit 2 is provided which is normally flat, and has the property of being flexed upon the application of an external force, but returning to the original state upon releasing the external force applied. Both ends of the piezoelectric unit 2 are supported by a case 7. A voltage is continuously generated in the piezoelectric unit 2 when it is relatively slowly flexed or when the flexure is removed to recover the original state. The voltage so produced is applied to a liquid crystal display element 1 shown in FIG. 5 to drive it. A pressurizing mechanism 3 is provided to flex the piezoelectric unit 2 slowly and generate a voltage therein. This mechanism consists of a button 3a fitted in an aperture 5 in a casing 4 of an electric insulating material and adapted to move in and out of the casing 4 and a pressure increasing member 3b for amplifying by a lever action the pressure exerted on the presser 3a and applying it to the piezoelectric unit 2. The pressure increasing member 3b is pivotally supported at its side end on a fixed shaft 6, and is urged against the lower end of the button 3a at its upper end and against the top surface of the piezoelectric unit 2 at its lower end. The normal states of the piezoelectric unit 2 and the pressurizing mechanism 3 are shown by solid lines in FIG. 1. When the button 3a is pushed by a finger, the pressure increasing member 3b rotates with the fixed shaft 6 as a fulcrum, and its lower end causes the deformation of the piezoelectric unit 2 to produce the state shown by dotted lines in FIG. 1. When the force exerted on the button 3a is released, the pressurizing mechanism 3 returns to the state shown by solid lines from the state shown by dotted lines by the recovery power of the piezoelectric unit 2.

FIG. 2 shows another embodiment of the pressurizing mechanism 3. In FIG. 2, a slide button 3'a is fitted in an elongated guide hole 5' formed in casing 4 so that it is movable along the guide hole and its lower end slides over the upper end of pressure increasing member 3b in the course of movement. In FIG. 2, the normal states of the piezoelectric unit 2 and the pressurizing mechanism 3 are shown by solid lines. When the button 3'A is moved along the guide hole 5', its lower end slides on the upper end of the pressure increasing member 3b to rotate the pressure increasing member about the fixed shaft 6 as a fulcrum. Incident to this, the lower end of pressure increasing member 3b deforms the piezoelectric unit 2 to cause the state shown by dotted lines in FIG. 2. Upon the returning of the presser 3b to the initial position, the pressure increasing member 3b returns to the state shown by solid lines from the state shown by dotted lines by the recovery power of the piezoelectric unit 2.

As the piezoelectric unit 2, the one described, for example, in Japanese Laid-Open Utility Model Publication No. 18772/76 may be used.

In FIG. 3, the reference numerals 201 and 202 represent elongated flat elastic insulating plates. The reference numeral 203 designates a closure-like elastic insulating plate having a larger thickness than the elastic insulating plates 201 and 202 and including a pair of through-holes 206 and 207 for insertion of a pair of lead wires 204 and 205. The reference numeral 208 designates an elongated flat piezoelectric element having a plurality of split electrodes 209 bonded thereto, and the reference numerals 210 and 211, a pair of electrode fixtures made by punching with a press or the like and subsequent bending which have a plurality of electrode terminals 212 and form at one end thereof sword tip-like projections 210A and 211A, respectively, which make contact with the lead wires. The elastic insulating plate 202 has holes 213 through which to insert the electrode terminals 212 along the side edge 202a.

Figure 4:
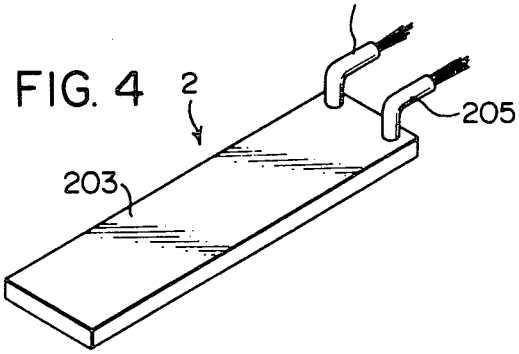
FIG. 4 is a perspective view of the piezoelectric unit built by assembling the component parts shown in FIG. 3.

These component parts are assembled in the following manner. The piezoelectric element 208 is bonded to the elastic insulating plate 201 by a film-like adhesive or a liquid adhesive. The elastic insulating plate 202 having the electrode terminals 212 of the electrode fixtures 210 and 211 inserted into the holes 213 is placed on the piezoelectric element 208 so that the electrode terminals 212 make contact with the split electrodes 209 on the piezoelectric element 208. The space between the two layers is filled with an adhesive. Then, the elastic insulating plate 203 is put over the resulting assembly and fixed in place by an elastic resin. The sword tip-like projections 210A and 211A of the electrode fixtures 210 and 211 are connected to the lead wires 204 and 205 through the holes 206 and 207. Thus, the piezoelectric unit 2 shown in FIG. 4 can be built.

In theory, there is a delay in the response of the liquid crystal display element 1. This phenomenon is considered to be unavoidable, and known as a rising time which is actually about 0.1 to 1.0 second. Therefore, a voltage above the threshold voltage must be applied to the liquid crystal display element 1 for a longer period of time than the rising time. A certain piezoelectric unit is available which is designed to generate a voltage by application of impact, but the voltage generated by such a piezoelectric unit is transitory or momentary and disappears within 0.05 second at the longest. The liquid crystal display element 1 cannot be operated by such a type of piezoelectric unit. In contrast, the piezoelectric unit 2 used in this invention designed to generate a voltage by flexing can provide a higher voltage than the threshold voltage of the liquid crystal display element for a sufficiently longer period of time than the rising time, and therefore, can easily drive the liquid crystal display element 1.

FIG. 5 is a cross-sectional view of the voltmeter of the invention in its entirety including the piezoelectric unit 2 and the pressurizing mechanism 3 described hereinabove. In FIG. 5, a liquid crystal display element 1 consists of a liquid crystal compound, two glass plates supporting the liquid crystal compound therebetween in sandwich form, and at least a pair of electrodes. DSM-type or FEM-type elements, for example, are applied as the liquid crystal display element. The reference numeral 8 designates an electrical circuit to be described below which can prolong the life of the liquid crystal display element 1 and increase the sensitivity of detection. The liquid crystal display element 1, the electric circuit 8, the piezoelectric unit 2 and the pressure increasing member 3b of the pressurizing mechanism 3 are enclosed in the casing 4. The reference numeral 9 represents a detecting electrode fitted to the tip of an electrode supporting portion 10 made of an electric insulator. The reference numeral 11 designates a high-voltage condenser disposed within the electrode support 10. The high-voltage condenser is made up of a rod-like or tubular internal electrode 11a electrically connected to the detection electrode 9, an electrically insulated tubular body 11b closed at one end and having the internal electrode 11a encased therein, and a tubular external electrode 11c provided externally in contact with the tubular body 11b. The reference numeral 12 represents a grounded electrode made of a thin metal plate or the like; 13, a grip portion made of an electric insulator and having the grounded electrode 12 included therein; 14, a detection window provided to detect the operation of the liquid crystal display element 1; 15, a hood provided around the display surface of the detection window 14 so as to prevent the generation of detrimental reflecting light; 16, a lighting window provided on both sides of the hood 15 for illuminating the liquid crystal display element. The liquid crystal display element 1, the piezoelectric unit 2, the high-voltage condenser 11 and the grounded electrode 12 are respectively connected to the electric circuit 8.

FIG. 6 shows one example of the electric circuit 8 applicable to the present invention. In this diagram, the reference numerals 17 and 18 designate condensers, and 19 and 20, Zener diodes. The piezoelectric unit 2 may also be directly connected to both poles of the liquid crystal display element 1. Since a decrease in detecting sensitivity which is ascribable to the connection of the piezoelectric unit 2 is only slight, the condenser 18 may be omitted.

In operating the voltmeter of this invention for voltage detection, the pressurizing mechanism 3 is actuated prior to detection to flex the piezoelectric unit 2 slowly, or to remove the flexure imparted. In the course of flexing or the removal of the imparted flexure, the piezoelectric unit 2 generates a voltage higher than the threshold voltage of the liquid crystal display element 1 for a longer period of time than the rising time, and this voltage is applied to the liquid crystal display element 1. By ascertaining the presence or absence of voltage display at this time through the window 14, it is possible to determine whether the liquid crystal display element 1 will operate normally.

The present invention can be applied broadly to voltmeters in general which are equipped with a liquid crystal display element. Accordingly, it can be applied not only to high-voltage voltmeters utilizing a liquid crystal display element alone, but also to high-voltage voltmeters using both a liquid crystal display element and a neon lamp and, of course, to low-voltage voltmeters.

What we claim is:

1. A voltmeter of the liquid crystal display type, said voltmeter comprising an electrically insulated casing, a detecting electrode secured to its forward end, a liquid crystal display element within the casing electrically connected to said detecting electrode, a grounded electrode within the casing electrically connected to said liquid crystal display element, and a window at the rear end of said casing for viewing the operation of said liquid crystal display element therethrough, said casing further including piezoelectric unit and a pressurizing mechanism so that the normal operation of said liquid crystal display element can be confirmed through said window by applying a voltage to said liquid crystal display element, said voltage being produced in said piezoelectric unit when said piezoelectric unit is flexed by said pressurizing mechanism wherein a condenser is disposed between, and electrically connected to, said detecting electrode and said liquid crystal display element, said condenser consisting of an electrically insulated tubular body having one closed end, an elongate internal electrode encased within said tubular body, and a tubular external electrode provided externally in contact with said tubular body.

2. The voltmeter of claim 1 wherein the internal electrode is a rod-like element.

3. The voltmeter of claim 1 wherein the internal electrode is a tubular element.

* * * * *